United States Patent
Boraten

(10) Patent No.: US 11,837,527 B2
(45) Date of Patent: Dec. 5, 2023

(54) SEMICONDUCTOR CHIP STACK WITH LOCKING THROUGH VIAS

(71) Applicant: ADVANCED MICRO DEVICES, INC., Santa Clara, CA (US)

(72) Inventor: Travis Boraten, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/936,629

(22) Filed: Jul. 23, 2020

(65) Prior Publication Data

US 2022/0028757 A1  Jan. 27, 2022

(51) Int. Cl.
| | | |
|---|---|---|
| H01L 23/48 | (2006.01) | |
| H01L 23/525 | (2006.01) | |
| H01L 25/18 | (2023.01) | |
| H01L 23/00 | (2006.01) | |
| H01L 25/00 | (2006.01) | |

(52) U.S. Cl.
CPC ........ H01L 23/481 (2013.01); H01L 23/5252 (2013.01); H01L 23/5256 (2013.01); H01L 25/18 (2013.01); H01L 25/50 (2013.01)

(58) Field of Classification Search
CPC .............. H01L 23/481; H01L 23/5252; H01L 23/5256; H01L 25/50; H01L 25/18; H01L 24/08; H01L 24/13; H01L 24/16; H01L 24/17; H01L 2224/06181; H01L 2224/08145; H01L 2224/13082; H01L 2224/131; H01L 2224/13147; H01L 2224/16145; H01L 2224/17181; H01L 2225/06513; H01L 2225/06517; H01L 2225/06541; H01L 25/0657; H01L 29/7827

See application file for complete search history.

(56) References Cited

U.S. PATENT DOCUMENTS

| | | |
|---|---|---|
| 5,043,533 A | 8/1991 | Spielberger |
| 7,466,584 B1 | 12/2008 | Parkinson et al. |
| 7,532,507 B2 | 5/2009 | Hayakawa |
| 8,012,874 B2 | 9/2011 | Li et al. |
| 8,525,296 B1 | 9/2013 | Lin et al. |
| 2002/0074643 A1 | 6/2002 | Khandros et al. |
| 2006/0108607 A1 | 5/2006 | Teshima et al. |
| 2006/0124982 A1 | 6/2006 | Ho et al. |

(Continued)

OTHER PUBLICATIONS

Toshisumi Yoshino et al.; Hitachi Chemical Co., Ltd.; *Advanced Photo-definable Solder Mask for High-performance Semiconductor Packages*; Jan. 2006; pp. 29-34.

(Continued)

*Primary Examiner* — Herve-Louis Y Assouman

(57) ABSTRACT

Various semiconductor chips and chip stack arrangements are disclosed. In one aspect, a semiconductor chip stack is provided that includes a first semiconductor chip and a second semiconductor chip stacked on the first semiconductor chip. The first semiconductor chip includes a first logic layer and a first semiconductor layer on the first logic layer. The first semiconductor layer has plural first through-silicon transistors operable to selectively control the transmission of data from the first semiconductor chip to the second semiconductor chip and has plural first through-silicon vias to convey control signals to the second semiconductor chip.

20 Claims, 9 Drawing Sheets

(56) References Cited

U.S. PATENT DOCUMENTS

| | | |
|---|---|---|
| 2006/0138591 A1 | 6/2006 | Amey, Jr. et al. |
| 2010/0308435 A1 | 12/2010 | Nowak et al. |
| 2011/0309519 A1* | 12/2011 | Kim .................. G11C 8/12 |
| | | 257/E23.174 |
| 2012/0267759 A1 | 10/2012 | Shroff et al. |
| 2014/0062587 A1* | 3/2014 | Koyanagi .......... H01L 25/0657 |
| | | 327/595 |
| 2014/0173238 A1* | 6/2014 | Ware .................. G09C 1/00 |
| | | 711/163 |
| 2014/0239444 A1 | 8/2014 | Yee |
| 2017/0092712 A1 | 3/2017 | Siegel et al. |
| 2019/0267362 A1* | 8/2019 | Feil .................... H01L 23/5384 |
| 2019/0332561 A1* | 10/2019 | Schreiber .............. G06F 13/385 |

OTHER PUBLICATIONS

Taiyo Ink Mfg. Co., Ltd.; *PSR-4000 AUS703 Material Safety Sheet*; Oct. 19, 2007; pp. 1-6.

L. Cadix et al.; *Integration and frequency dependent electrical modeling of Through silicon Vias (TSV) for high density 3DICs*; IEEE; 2010; pp. 1-3.

Wikipedia; *Modulo Operation*; https://en.wikipedia.org/wiki/Modulo_operation; pp. 1-14.

Felix Winkler et al.; *TSV Trasnsistor-Vertical Metal Gete FET Inside a Through Silicon VIA*; IEEE Electron Device Letters, vol. 39, No. 10; Oct. 2018; pp. 1-4.

Samuel K. Moore; *Through-Silicon Transistors Could Make Stacking Chips Smarter*; IEEE Spectrum; Oct. 1, 2018; pp. 1-4.

Moore, Through-Silicon Transistors Could Make Stacking Chips Smarter, IEEE Spectrum, Oct. 1, 2018, 7 pages.

* cited by examiner

SEMICONDUCTOR CHIP STACK WITH LOCKING THROUGH VIAS

BACKGROUND OF THE INVENTION

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

Stacked dice arrangements involve placing or stacking one or more semiconductor chips on a base semiconductor chip. In some conventional variants, the base semiconductor chip is a high heat dissipating device, such as a microprocessor. The stacked chips are sometimes memory devices. The semiconductor chips in the stack often include through-silicon vias (TSVs) to pass power, ground and signals from one semiconductor chip to the next. In a typical conventional semiconductor chip stack, the TSVs in one chip are vertically aligned with the TSVs in the next chip and so on, such that the TSVs function like a data bus.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
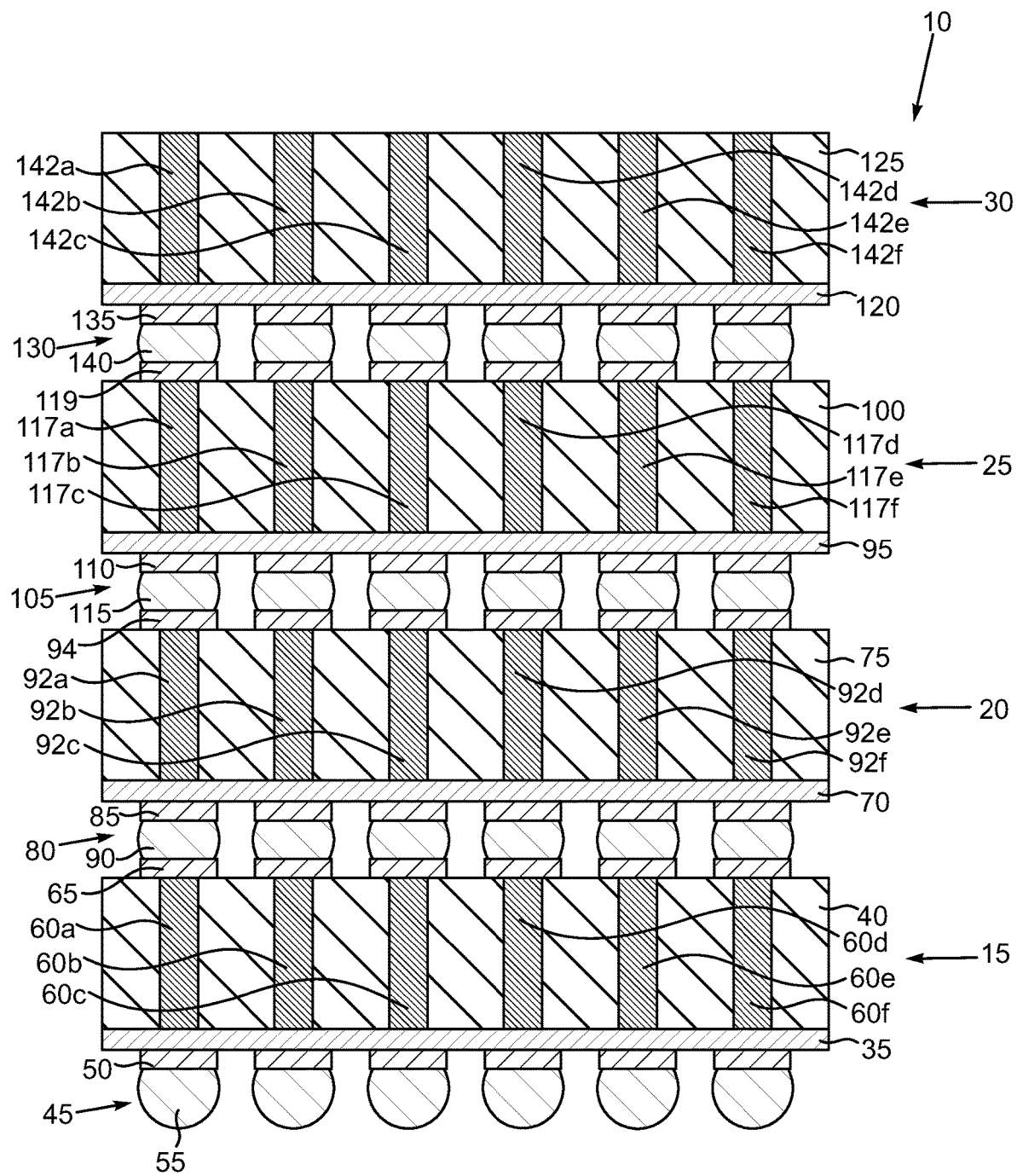
FIG. 1 is a schematic sectional view of an exemplary conventional semiconductor chip stack.

The designs for modern semiconductor chips are created using computer tools to generate a complex data file called a "tapeout". Where the creator of the tapeout does not fabricates its own chips, the tapeouts are sent to third party fabricators that do the actual semiconductor chip fabrication. It is possible for a nefarious actor to intercept the tapeout data and inject unwanted and potentially malicious circuitry into the design that would cause the manufactured chip to malfunction, reveal secret information, or otherwise fail to meet specifications. Stacked chip designs represent a variant of this risk. For a given chip stack, there is the possibility that the chips of the stack are manufactured by multiple different fabs. One or more of the third-party supplied semiconductor chips can contain malicious circuitry. Conventional chip stack designs typically use TSVs in each semiconductor chip. Together, these TSVs act like a data bus, which means that data sent from one semiconductor chip to another semiconductor chip in the stack can be observed by all the semiconductor chips in the stack. This can be a problem where one of the semiconductor chips includes malicious circuitry capable of snooping on the data flowing in the stack.

The disclosed arrangements provide chip stacking with compartmentalized data flow. Data sent from one chip to another is prevented from flowing to various other semiconductor chips in the stack. In another arrangement, data destined for a particular semiconductor chip is encrypted before transmission and then decrypted at the destination chip. Intervening semiconductor chips will not see encrypted data, not the true data. Various encryption/decryption circuits are disclosed. Through-silicon field effect transistors are used in lieu of traditional TSVs for the data flow. Additional details will now be described.

In accordance with one aspect of the present invention, a semiconductor chip stack is provided that includes a first semiconductor chip and a second semiconductor chip stacked on the first semiconductor chip. The first semiconductor chip includes a first logic layer and a first semiconductor layer on the first logic layer. The first semiconductor layer has plural first through-silicon transistors operable to selectively control the transmission of data from the first semiconductor chip to the second semiconductor chip and has plural first through-silicon vias to convey control signals to the second semiconductor chip.

In accordance with another aspect of the present invention, an apparatus is provided that includes a first semiconductor chip operable to have a second semiconductor chip stacked thereon. The first semiconductor chip includes a first logic layer and a first semiconductor layer on the first logic layer. The first semiconductor layer has plural first through-silicon transistors operable to selectively control the transmission of data from the first semiconductor chip to the second semiconductor chip and has plural first through-silicon vias to convey control signals to the second semiconductor chip. The first semiconductor chip includes an encryption circuit operable to encrypt the data.

In accordance with another aspect of the present invention, a method of manufacturing is provided that includes stacking a first a first semiconductor chip on a second semiconductor chip. The second semiconductor chip includes a first logic layer and a first semiconductor layer on the first logic layer. The first semiconductor layer has plural first through-silicon transistors operable to selectively control the transmission of data from the second semiconductor chip to the first semiconductor chip and has plural first through-silicon vias to convey control signals to the first semiconductor chip.

In the drawings described below, reference numerals are generally repeated where identical elements appear in more than one figure. Turning now to the drawings, and in particular to FIG. 1, therein is shown a sectional view of an exemplary conventional chip stack 10 that includes four semiconductor chips 15, 20, 25 and 30. The bottommost semiconductor chip 15 includes a back end of line or BEOL 35 which includes the various logic structures that make up the functionality of the semiconductor chip 15 as well as plural metallization layers that enable the logic devices of the BEOL 35 to connect to other conductor structures. In addition, the semiconductor chip 15 includes a bulk silicon portion 40 to interface electrically with another structure such, the semiconductor chip 20. To electrically interface with an underlying structure, such as a circuit board (not shown), the semiconductor chip 15 includes plural interconnects 45 which each consist of a bump pad 50 and a solder bump 55. To interface electrically with overlying structures, the bottommost semiconductor chip 15 includes plural through-silicon-vias 60a, 60b, 60c, 60d, 60e and 60f, which extend vertically through the bulk silicon portion 40. The TSVs 60a, 60b, 60c, 60d, 60e and 60f terminate at respective bump pads 65.

The semiconductor chip 20 similarly includes a BEOL 70, and a bulk silicon portion 75. In addition, the semiconductor chip 20 includes plural interconnects 80, which consist of a bump pad 85 and a solder bump 90. The solder bumps 90 are connected to respective of the bump pads 65 of the semiconductor chip 15. Like the semiconductor chip 15, the semiconductor chip 20 includes plural TSVs 92a, 92b, 92c, 92d, 92e and 92f. However, the TSVs 92a, 92b, 92c, 92d, 92e and 92f traverse the bulk silicon portion 75.

The semiconductor chip 25 similarly consists of a BEOL 95 and a bump silicon portion 100. In addition, the semiconductor chip 25 includes the plural interconnects 105 each of which consists of a bump pad 110 and a solder bump 115. Like the semiconductor chip 20, the semiconductor chip 25 includes plural TSVs 117a, 117b, 117c, 117d, 117e and 117f. However, the TSVs 117a, 117b, 117c, 117d, 117e and 117f traverse the bulk silicon portion 100. Finally, the semiconductor chip 30 consists of a BEOL 120 and a bump silicon portion 125. In addition, the semiconductor chip 30 includes the plural interconnects 130 each of which consists of a bump pad 135 and a solder bump 140. The topmost chip 30 also includes plural TSVs 142a, 142b, 142c, 142d, 142e and 142f, which traverse the bulk silicon portion 125.

The semiconductor chip 15 is operable to send data signals to the semiconductor chips 20, 25 and 30 and to receive data signals back from those same chips 20, 25 and 30. In this regard, a set of TSVs, such as the TSVs 60a, 92a, 117a and 142a, function as a data bus, another set of TSVs 60e, 92e, 117e and 142e function as another data bus and so on for the other TSVs of the semiconductor chips 15, 20, 25 and 30. While this has the advantage of providing relatively speedy pathways for the data signals flowing between the semiconductor chips 15, 20, 25 and 30, there are some pitfalls to be described in conjunction with FIG. 2.

Figure 2:
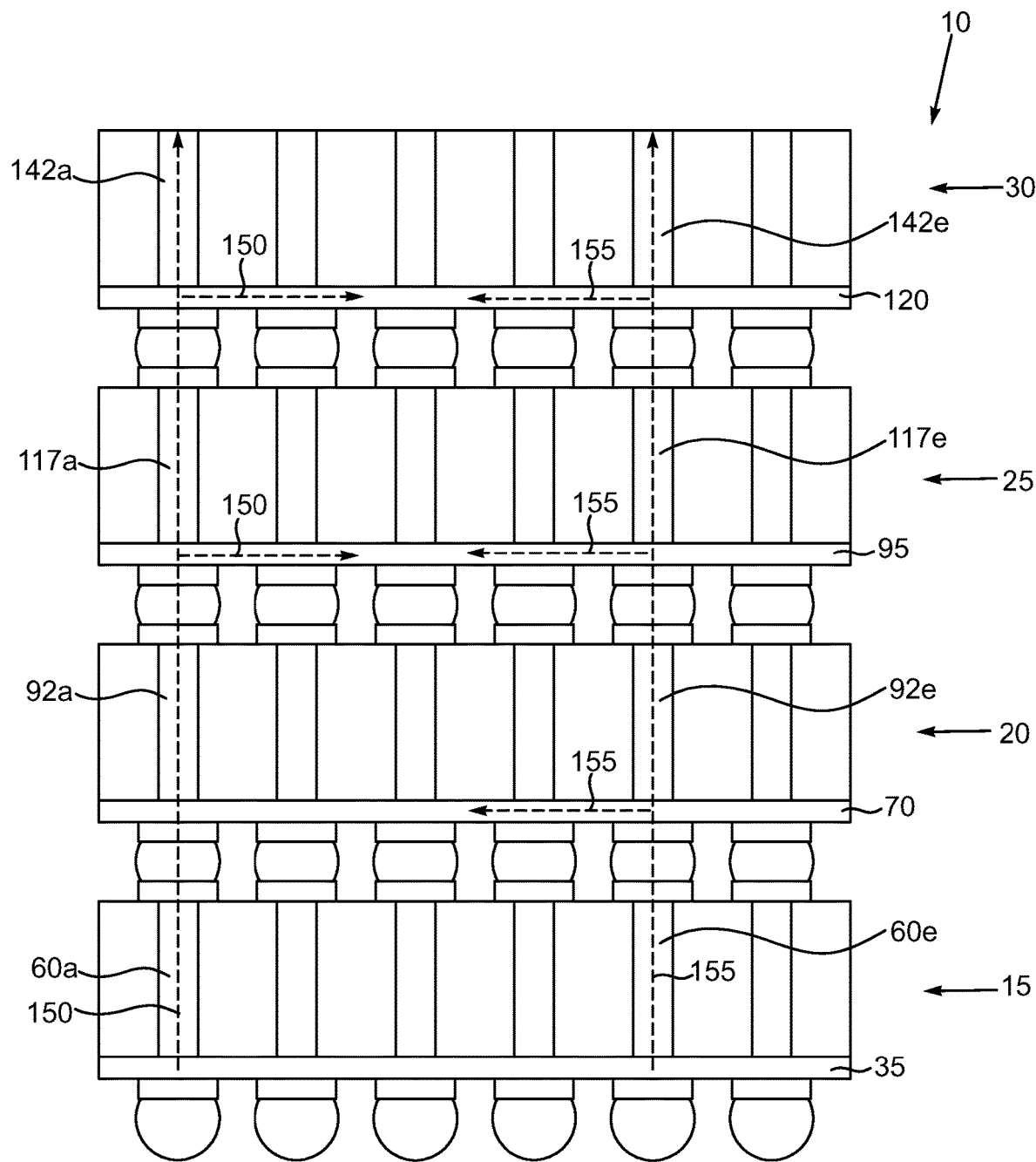
FIG. 2 is the schematic sectional view of the exemplary conventional semiconductor chip stack of FIG. 1 but with signal depiction.

Attention is now turned to FIG. 2, which is a sectional view like FIG. 1 but without cross-hatching so that the movement of data signals can be more easily illustrated and viewed. Assume for the purposes of this illustration that the semiconductor chip 15, and in particular the BEOL 35 thereof, transmits a data signal 150 that is intended for delivery to and use by the semiconductor chip 25. The data signal 150 is transmitted along the functional data bus consisting of the TSV 60a, the TSV 92a and ultimately to the BEOL 95 of the semiconductor chip 25. However, because of the bus-like nature of the TSVs 60a, 92a, 117a and 142a in the stack 10, the data signal 150 is also conveyed to the BEOL 120 of the semiconductor chip 30. Assume also for this illustration, that the BEOL 35 of the semiconductor chip 15 conveys a data signal 155 that is intended for consumption by the semiconductor chip 30. In this regard, the data signal 155 is conveyed from the BEOL 35 through the functional bus consisting of the TSV 60e, the TSV 92e, the TSV 117e and ultimately to the BEOL 120 of the semiconductor chip 30. However, because of the bus-like nature of the TSVs 60a, 92a, 117a and 142a, 60e, 92e, 117e and 142e of the semiconductor chip stack 10, the data signal 155 is as noted also seen by the semiconductor chip 30 and the data signal 155, which is intended for consumption only by the semiconductor chip 30 is also seen by the semiconductor chips 20 and 25. A difficulty arises if one or more of the semiconductor chips 15, 20, 25 or 30 includes nefarious logic that is capable of snooping on the data signals that are not necessarily intended for a given chip. For example, since the semiconductor chip 30 is also a recipient of the data signal 150, if that semiconductor chip 30 is considered nefarious, there is a potential for unwanted snooping of the data signal 150. Similarly, if the semiconductor chips 20 and 25 are considered nefarious, they nevertheless are recipients of the data signal 155 that is ultimately intended only for the semiconductor chip 30.

Figure 3:
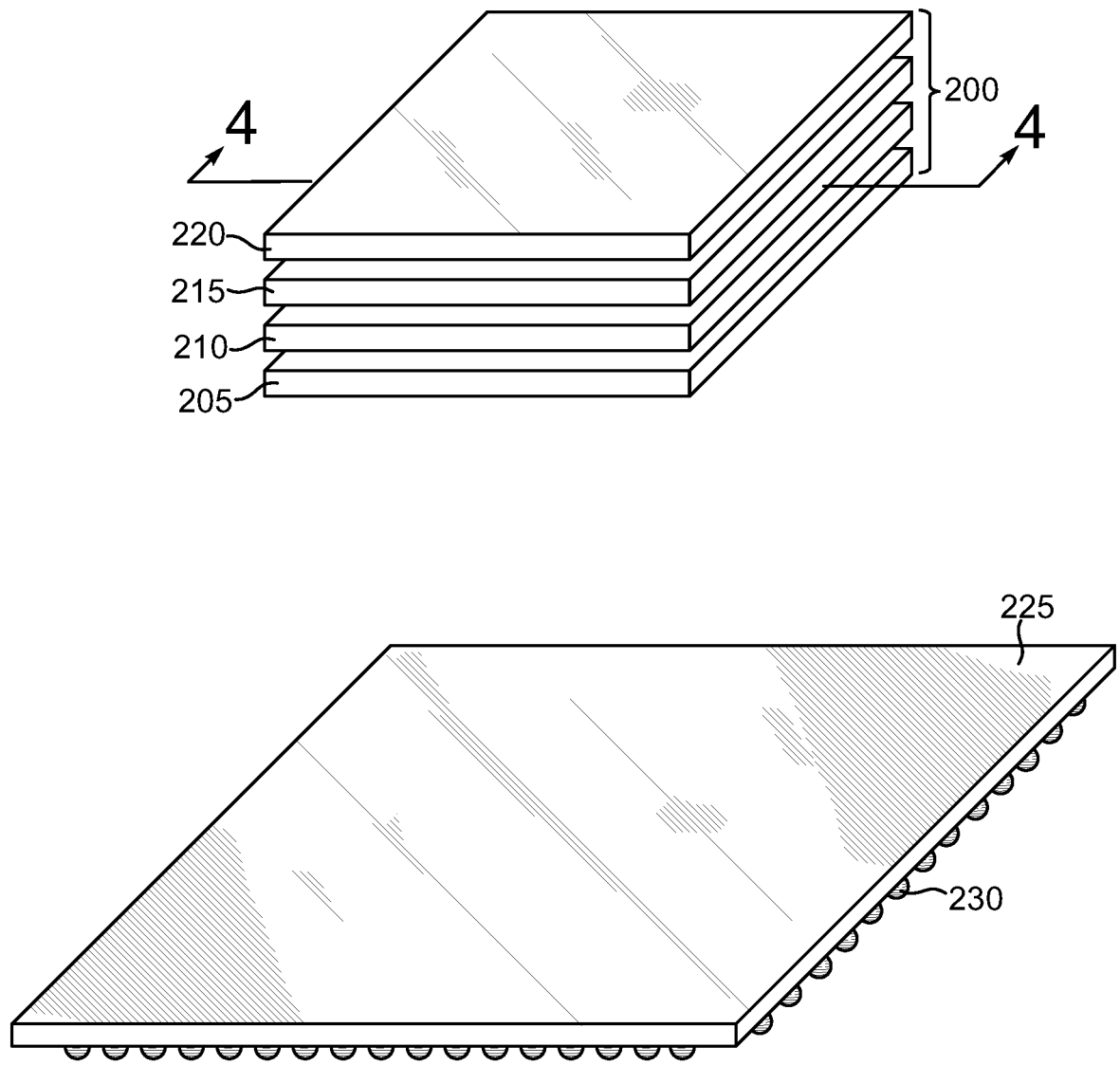
FIG. 3 is a partially exploded pictorial view of an exemplary new chip stack arrangement.

FIG. 3 is a partially exploded pictorial view of an exemplary new arrangement of a chip stack 200 that includes semiconductor chips 205, 210, 215 and 220. The semiconductor chip stack 200 is configured to be mounted on another device such as the circuit board 225. The circuit board 225 can be a package substrate, a system board, a circuit card, a daughter card or other. To interface electrically with another device, the circuit board 225 can include plural interconnects 230, which can be the solder balls depicted or other types of interconnects such as pins, lands or others. The semiconductor chips 205, 210, 215 and 220 can be any of a variety of integrated circuits. A non-exhaustive list of examples includes processors, such as microprocessors, graphics processing units, accelerated processing units that combine aspects of both, memory devices, systems-on-chip, an application integrated specific circuit or other. In this illustrative arrangement, the semiconductor chip stack 200 includes the four semiconductor chips 205, 210, 215 and 220. However, the skilled artisan will appreciate that other than four chips can be used for the semiconductor chip stack 200 and any disclosed alternatives.

Figure 4:
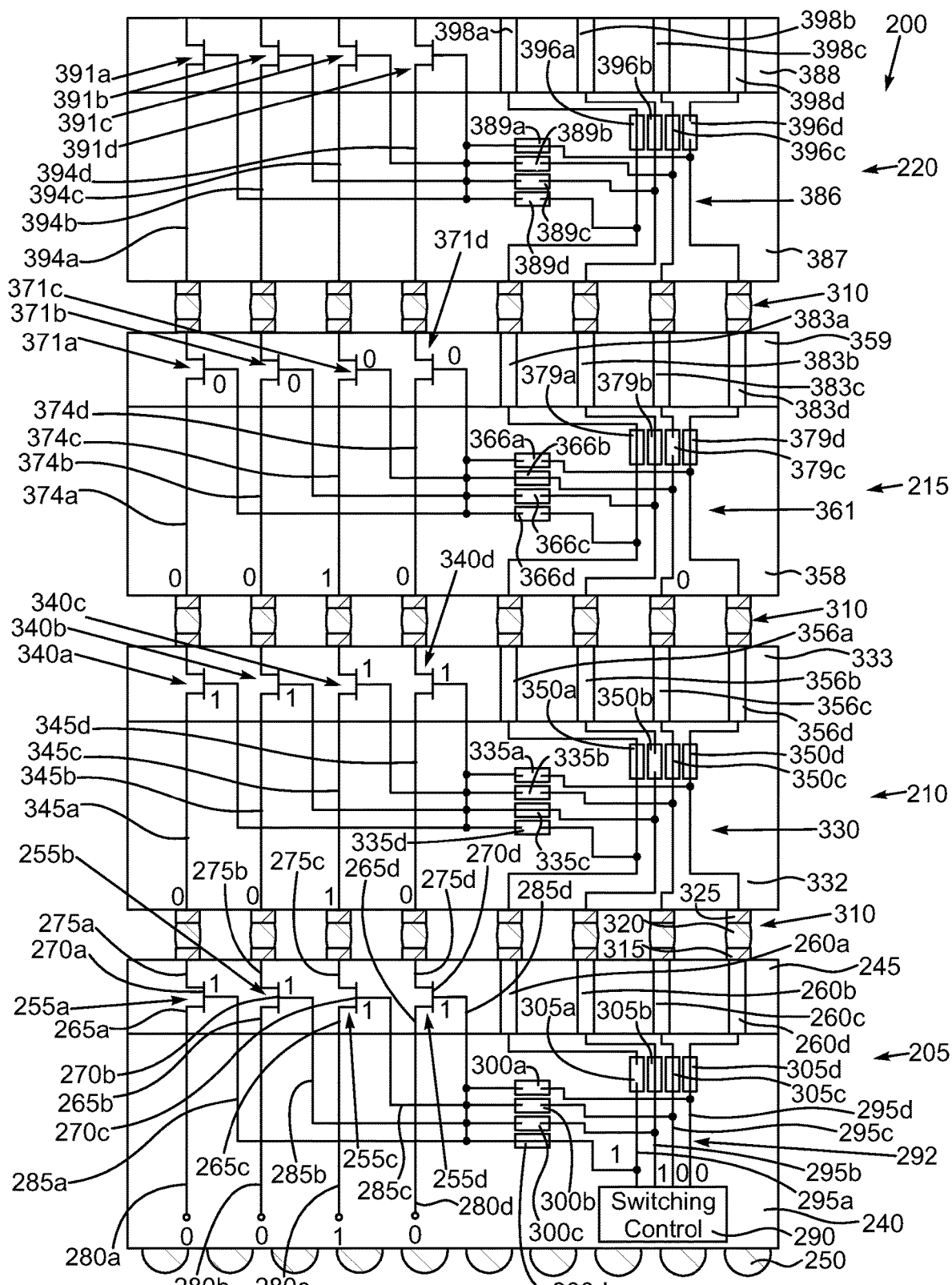
FIG. 4 is a schematic sectional view of FIG. 3 taken at section 4-4.

Additional details of the semiconductor chip stack 200 can be understood by referring now also to FIG. 4, which is a sectional-like view of FIG. 3 taken at section 4-4. FIG. 4 has attributes of a sectional view but various of the circuit structures within the semiconductor chips 205, 210, 215 and 220 are depicted schematically. The semiconductor chip 205 is the lowermost chip in the stack 200 and consists of a logic layer or BEOL 240 and a bulk semiconductor portion 245. Here, it should be understood that the BEOL 240 and the bulk semiconductor portion 245 are not depicted with accurate proportions in that the bulk semiconductor portion 245 in reality can be substantially thicker than the BEOL 240. The BEOL 240 includes plural interconnects 250, which can be solder balls, bumps, conductive pillars or other types of interconnect structures that are designed to make electrical connections to the circuit board 225 depicted in FIG. 3 or to some other semiconductor chip (not shown). The BEOL 240 includes various logic (not shown) that provides the basic functionality of the semiconductor chip 205. These so-called logic or IP blocks can include memory, arithmetic logic units, or virtually any other type of IP blocks. The BEOL 240 includes separate data pathways and control signal pathways. As noted above, in the conventional arrangement depicted in FIGS. 1 and 2, a typical data pathway is a bus-like structure consisting of, for example, the stack of TSVs 60a, 92a, 117a and 142a. However, in this new illustrative arrangement depicted in FIGS. 3 and 4, the data pathways for a given chip such as the semiconductor chip 205 utilizes controlled switching to selectively pass or not pass data from the semiconductor chip 205 to other locations in the semiconductor chip stack 200. In this regard, the bulk semiconductor portion 245 includes plural through-silicon transistors 255a, 255b, 255c and 255d in lieu of regular TSVs. In this illustrative arrangement and the other disclosed arrangements, the through-silicon-transistors 255a, 255b, 255c and 255d are implemented as through-silicon field effect transistors (TFETs), and more particularly enhancement mode TFETs, but other through-silicon transistors could be used. Indeed, the term "through-silicon" as used herein is not limited to silicon, since other semiconductor materials, such as germanium or the like could be used for the semiconductor portion 245 and the other disclosed semiconductor portions. To provide control signal pathways, the bulk semiconductor portion 245 includes plural TSVs 260a, 260b, 260c and 260d. The TFETs 255a, 255b, 255c and 255d include respective sources 265a, 265b, 265c and 265d, respective gates 270a, 270b, 270c and 270d and respective drains 275a, 275b, 275c and 275d. The sources 265a, 265b, 265c and 265d are connected to respective data lines 280a, 280b, 280c and 280d of the BEOL 240. The data lines 280a, 280b, 280c and 280d are simply data conductors that are operable to convey data signals from elsewhere in the BEOL 240 to the sources 265a, 265b, 265c and 265d. The gates 270a, 270b, 270c and 270d are connected to respective control lines 285a, 285b, 285c and 285d of the BEOL 240, which are in turn connected to a switching control logic block 290 also of the BEOL 240. The switching control logic block 290 is operable to convey HIGH or LOW signals that are used to turn on or off the TFETs 255a, 255b, 255c and 255d as well as similar TFETs in the semiconductor chips 210, 215 and 220, which are discussed below. The switching control logic block 290 is connected and outputs to a gate control network 292. The gate control network 292 includes output lines 295a, 295b, 295c and 295d that are connected to the TSVs 260a, 260b, 260c and 260d, respectively, and commonly and in parallel to the control lines 285a, 285b, 285c and 285d. Note, however, that the control lines 285a, 285b, 285c and 285d of the gate control network 292 include respective programmable elements 300a, 300b, 300c and 300d. The arrangements described herein use antifuses as an example of a programmable element. However, the skilled artisan should appreciate that the following description is applicable to fuses, antifuses, ovonic devices, or like programmable elements. Three of the programmable elements, for example, programmable elements 300a, 300b and 300c, can be blown or otherwise programmed so that an on/off signal to the gates 270a, 270b, 270c and 270d is delivered via a particular control line such as, for example, the control line 285a since the programmable element 300d has not been blown. Of course, the same effect can be achieved by blowing programmable elements 300a, 300b and 300d while leaving programmable element 300c intact and thus gate control signals will be delivered to the gates 270a, 270b, 270c and 270d by way of the control line 285c and so on.

The output lines 295a, 295b, 295c and 295d of the gate control network 292 similarly include programmable elements 305a, 305b, 305c and 305d. By selectively blowing or otherwise programming one of the programmable elements 305a, 305b, 305c and 305d, a control signal from the switching control logic block 290 can be prevented from propagating up through the semiconductor chip stack 200. For example, assume for the purposes of this discussion that the programmable element 305a has been blown. In this instance, a control signal on the output line 295a will be delivered to the gates 270a, 270b, 270c and 270d but be prevented from propagating up to the semiconductor chips 210, 215 and 220 since the programmable elements 305b, 305c and 305d have not been blown and thus the output lines 295b, 295c and 295d remain available for propagation of control signals to the semiconductor chips 210, 215 and 220.

Electrical communication between adjacent chips for the semiconductor chip stack 200, such as the semiconductor chips 205 and 210, can be by way of plural interconnects 310, which can consist of a conductor pad 315 on an underlying chip such as the semiconductor chip 205, a solder bump 320 connected to the lower pad 315 and an upper conductor pad 325 connected to the overlying chip, such as the semiconductor chip 210. Optionally, the interconnects 310 can consist of conductive pillars with or without solder caps, so-called hybrid bonds that involve the direct metallurgical connection of one conductor structure to another such as two copper pillars or other types of interconnects as desired.

The semiconductor chip 210 is the next higher chip in the stack 200 and consists of a BEOL 332 and a bulk semiconductor portion 333, which can be substantially similar to the BEOL 240 and the bulk semiconductor portion 245 of the semiconductor chip 205. The semiconductor chip 210 includes a gate control network 330, which can be substantially similar to the gate control network 292 in the semiconductor chip 205 and as described above. However, the gate control network 330 of the semiconductor chip 210 is connected to the TSVs 260a, 260b, 260c and 260d, and thus the switching control logic block 290, of the semiconductor chip 205 by way of the interconnects 310. The gate control network 330 includes plural programmable elements 335a, 335b, 335c and 335d that control the flow of gate control signals to respective TFETs 340a, 340b, 340c and 340d of the bulk semiconductor portion 333 of the semiconductor chip 210. The TFETs 340a, 340b, 340c and 340d can be substantially identical to the TFETs 255a, 255b, 255c and 255d in the semiconductor chip 205 and as described above, and for simplicity of illustration the gates, sources and drains of the TFETs 340a, 340b, 340c and 340d are not separately numbered. The TFETs 340a, 340b, 340c and 340d are connected to respective data lines 345a, 345b, 345c and 345d, which are in turn connected to the TFETs 255a, 255b, 255c and 255d by way of some of the interconnects 310. The gate control network 330 also includes plural programmable elements 350a, 350b, 350c and 350d that are selectively blown or not in order to pass or not pass control signals up through the semiconductor chip 210 to the overlying chip 215. Here, it is assumed for the purposes of this discussion that the programmable elements 335a, 335b and 335d have been blown but the programmable element 335c has not and thus gate control signals will be conveyed through the unblown programmable element 335c to provide gate control signals to the gates of the TFETs 340a, 340b, 340c and 340d. Similarly, it is assumed that the programmable elements 350a, 350c and 350d have not been blown but the programmable element 350b has been blown. The programmable elements 335a, 335b, 335c, 335d, 350a, 350b, 350c and 350d can be like the programmable elements 300a, 300b, 300c, 300d, 305a, 305b, 305c and 305d described above. The semiconductor chip 210 includes plural TSVs 356a, 356b, 356c and 356d that are positioned in the bulk semiconductor portion 333.

The semiconductor chip 215 is the next higher chip in the stack 200 and consists of a BEOL 358 and a bulk semiconductor portion 359, which can be substantially similar to the BEOL 332 and the bulk semiconductor portion 333 of the semiconductor chip 210. The semiconductor chip 215 includes a gate control network 361, which can be substantially similar to the gate control network 292 in the semiconductor chip 205 and as described above. However, the gate control network 361 of the semiconductor chip 215 is connected to the TSVs 356a, 356b, 356c and 356d of the semiconductor chip 210 by way of the interconnects 310. The gate control network 361 includes plural programmable elements 366a, 366b, 366c and 366d that control the flow of gate control signals to respective TFETs 371a, 371b, 371c and 371d of the bulk semiconductor portion 359 of the semiconductor chip 215. The TFETs 371a, 371b, 371c and 371d can be substantially identical to the TFETs 255a, 255b, 255c and 255d in the semiconductor chip 205 and as described above. The TFETs 371a, 371b, 371c and 371d are connected to respective data lines 374a, 374b, 374c and 374d, which are in turn connected to the TFETs 340a, 340b, 340c and 340d of the semiconductor chip 210 by way of some of the interconnects 310. The gate control network 361 also includes plural programmable elements 379a, 379b, 379c and 379d that are selectively blown or not in order to pass or not pass control signals up through the semiconductor chip 215 to the overlying chip 220. Here, it is assumed for the purposes of this discussion that the programmable elements 366a, 366c and 366d have been blown but the programmable element 366b has not and thus gate control signals will be conveyed through the unblown programmable element 366b to provide gate control signals to the gates of the TFETs 371a, 371b, 371c and 371d. Similarly, it is assumed that the programmable elements 379a, 379b and 379d have not been blown but the programmable element 379c has been blown. The programmable elements 366a, 366b, 366c, 366d, 379a, 379b, 379c and 379d can be like the programmable elements 300a, 300b, 300c, 300d, 305a, 305b, 305c and 305d described above. The semiconductor chip 215 includes plural TSVs 383a, 383b, 383c and 383d that are positioned in the bulk semiconductor portion 359.

The semiconductor chip 220 is the topmost chip in the stack 200 and consists of a BEOL 387 and a bulk semiconductor portion 388, which can be substantially similar to the BEOL 358 and the bulk semiconductor portion 359 of the semiconductor chip 215. The semiconductor chip 220 includes a gate control network 386, which can be substantially similar to the gate control network 292 in the semiconductor chip 205 and as described above. However, the gate control network 386 of the semiconductor chip 220 is connected to the TSVs 383a, 383b, 383c and 383d of the semiconductor chip 215 by way of the interconnects 310. The gate control network 386 includes plural programmable elements 389a, 389b, 389c and 389d that control the flow of gate control signals to respective TFETs 391a, 391b, 391c and 391d in the bulk semiconductor portion 388 of the semiconductor chip 220. The TFETs 391a, 391b, 391c and 391d can be substantially identical to the TFETs 255a, 255b, 255c and 255d in the semiconductor chip 205 and as described above. The TFETs 391a, 391b, 391c and 391d are connected to respective data lines 394a, 394b, 394c and 394d, which are in turn connected to the TFETs 371a, 371b, 371c and 371d of the semiconductor chip 215 by way of some of the interconnects 310. The gate control network 386 also includes plural programmable elements 396a, 396b, 396c and 396d that are selectively blown or not in order to pass or not pass control signals up through the semiconductor chip 215 to an overlying chip in the event the semiconductor chip 220 does have another semiconductor chip stacked thereon. Here, it is assumed for the purposes of this discussion that the programmable elements 389b, 389c and 389d have been blown but the programmable element 389a has not and thus gate control signals will be conveyed through the unblown programmable element 389a to provide gate control signals to the gates of the transistors 391a, 391b, 391c and 391d. Similarly, it is assumed that the programmable elements 396a, 396b and 396c have not been blown but the programmable element 379d has been blown, although selective fusing and usage of the gate control network 386 is technically unnecessary where the semiconductor chip 220 does not have an overlying chip stacked thereon. The programmable elements 389a, 389b, 389c, 389d, 396a, 396b, 396c and 396d can be like the programmable elements 300a, 300b, 300c, 300d, 305a, 305b, 305c and 305d of the semiconductor chip 205 described above. The semiconductor chip 220 includes plural TSVs 398a, 398b, 398c and 398d that are positioned in the bulk semiconductor portion 388, but which need not be used if there is no additional semiconductor chip stacked on the semiconductor chip 220.

Exemplary data transmission for the semiconductor chip stack 200 will now be described. In this simple illustration, it is assumed that the semiconductor chip 205 will transmit a simple 4-bit number 0010 to the semiconductor chip 215. Of course it should be understood that other than the number 0010 and other than 4-bit data handling could be used in this and the other disclosed arrangements. Initially, some bit of logic (not shown) in the semiconductor chip 205 generates the 0010 value and those individual bits are deployed on the data lines 280a, 280b, 280c and 280d. The switching control logic block 290 generates a logic 1 HIGH signal that is delivered to the gates 270a, 270b, 270c and 270d by way of the pathway associated with the un-blown programmable element 300d. The logic 1 HIGH signals turn on the transistors 255a, 255b, 255c and 255d and the 0010 value is transmitted to the data lines 345a, 345b, 345c and 345d of the semiconductor chip 210. However, the logic 1 HIGH signal delivered to the pathway that involves the programmable element 300d is not propagated upward to the semiconductor chip 210 since the programmable element 305a has been blown. However, the switching control logic block 290 does deliver gate control signals through the unblown programmable elements 305b, 305c and 305d and ultimately the TSV's 260b, 260c and 260d. In the semiconductor chip 210, the logic 1 HIGH control signal delivered by way of the TSV 260b is delivered to the gates of the transistors 340a, 340b, 340c and 340d by way of the pathway including the unblown programmable element 335c. The logic HIGH 1 signals at the gates of the transistors 340a, 340b, 340c and 340d turns those transistors on and thus the digital value 0010 is transmitted from the semiconductor chip 210 to the data lines 374a, 374b, 374c and 374d of the semiconductor chip 215. The switching control logic block 290 prevents the data values 0010 from being transmitted beyond the semiconductor chip 215, i.e., to the semiconductor chip 220 by delivering a logic LOW 0 signal through the unblown programmable element 305c, the TSV 260c, the unblown programmable element 350c of the semiconductor chip 210, the TSV 356c of the semiconductor chip 210 and ultimately to the pathway that includes the unblown programmable element 366b. That logic 0 LOW signal is then conveyed to the gates of the transistors 371a, 371b, 371c and 371d to thus turn those transistors off. In this way, the data value 0010 cannot be snooped on by the semiconductor chip 220. This type of selective locking down of data pathways for the semiconductor chips 210, 215 and 220 can be done whenever it is desired to limit the propagation of data to one or more semiconductor chips in the semiconductor chip stack 200. For example, the semiconductor chip 205 can deliver a data value to the semiconductor chip 210, and by shutting off the transistors 340a, 340b, 340c and 340d, that data value will not be propagated to the overlying chips 215 and 220. Note that the foregoing data transmission can occur repeatedly for all sorts of data values and at speeds as fast or slow as the semiconductor chip architecture of the semiconductor chip stack 200 allows.

Figure 5:
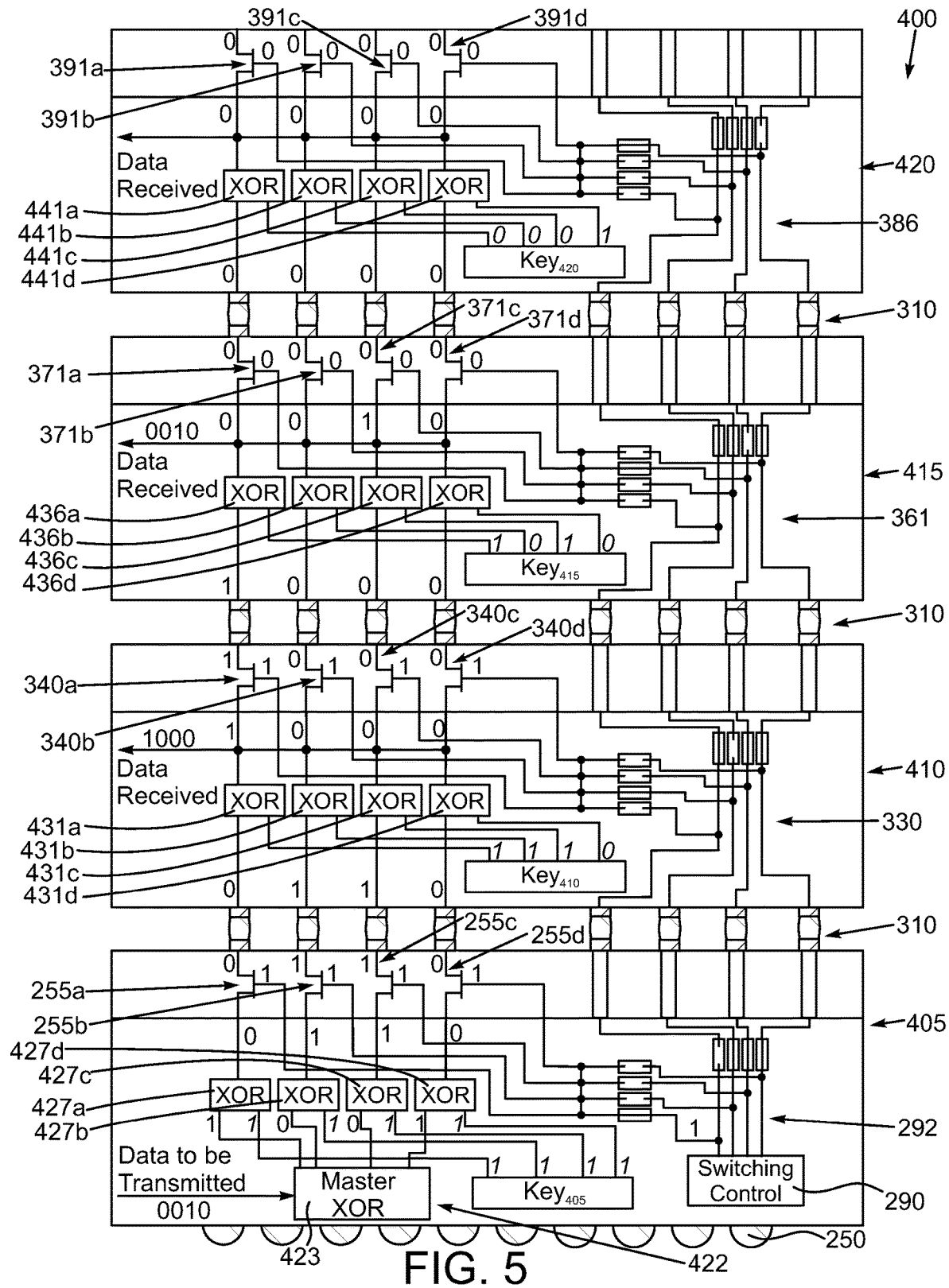
FIG. 5 is a schematic sectional view like FIG. 4, but of an alternate exemplary arrangement of a chip stack arrangement.

An alternate exemplary arrangement of a semiconductor chip stack 400 may be understood by referring now to FIG. 5. FIG. 5 is a sectional-like schematic view similar to FIG. 4 and depicts the semiconductor chip stack 400 with semiconductor chips 405, 410, 415, and 420. The semiconductor chips 405, 410, 415 and 420 share many of the same attributes as the semiconductor chips 205, 210, 215 and 220 depicted in FIG. 4 and described above. In this regard, the semiconductor chip 405 includes the TFETs 255a, 255b, 255c and 255d as well as the interconnects 250, the switching control logic block 290 and the gate control network 292. The individual components of the gate control network 292 will not be shown in FIG. 5 for simplicity of illustration. The semiconductor chip 410 similarly includes the TFETs 340a, 340b, 340c and 340d, as well as the gate control network 330, which like the gate control network 292, will not include additional element numbering of the individual components for simplicity of illustration. The semiconductor chips 405 and 410 are electrically connected by way of the plural interconnects 310. Similar pluralities of the interconnects 310 connect the semiconductor chips 410 and 415 and 415 and 420, respectively. The semiconductor chip 415 similarly includes the TFETs 371a, 371b, 371c and 371d, as well as the gate control network 361. Finally, the semiconductor chip 420 includes the TFETs 391a, 391b, 391c and 391d as well as the gate control network 386.

In the arrangement of the semiconductor chip stack 200 depicted in FIG. 4 and described above, data is transferred through the stack 200 in the clear. However, the exemplary arrangement of the semiconductor chip stack 400 incorporates encryption schemes in order to encrypt data that is transferred from one chip to another. This illustrative encryption scheme will now be described. To simplify the discussion, a simple 4-bit data transmission scheme will be described. However, the skilled artisan will appreciate that other than 4-bit data can be handled with appropriate scaling up of the hardware to be described. The semiconductor chip 405 includes an encryption circuit 422 that includes a Master exclusive OR (XOR) block 423, a 4-bit encryption key $Key_{405}$ and four XOR gates 427a, 427b, 427c and 427d. The master XOR block 423 has 4 outputs, one for each of the XOR gates 427a, 427b, 427c and 427d. Because this is a 4-bit example, encryption $Key_{405}$ includes 4 key bits. In this illustrative arrangement the $Key_{405}$ bits are 1111, but they, and any other disclosed key bits, could be any 4-bit (or other length) number or word. Note that the $Key_{405}$ bits 1111 are denoted in italics to distinguish them from the outputs of the master XOR block 423. The encryption key $Key_{405}$ (and any other disclosed keys) can be stored in firmware, non-volatile memory or other. While a 4-bit example is used for simplicity of illustration, the skilled artisan will appreciate that 32-bit, 64-bit, 128-bit, 256-bit or other length keys could be used. The semiconductor chip 410 includes a four bit $Key_{410}$ with four key bits 1110, the semiconductor chip includes a four bit key $Key_{415}$ with key bits 1010 and the semiconductor chip 420 includes a four bit key $Key_{420}$ with key bits 0001. Table 1 below summarizes the key bits for the keys $Key_{405}$, $Key_{410}$, $Key_{415}$ and $Key_{420}$.

TABLE 1

| Key | Key bits |
|---|---|
| $Key_{405}$ | $Key_{405}$ bits = 1111 |
| $Key_{410}$ | $Key_{410}$ bits = 1110 |
| $Key_{415}$ | $Key_{415}$ bits = 1010 |
| $Key_{420}$ | $Key_{420}$ bits = 0001 |

The $Key_{405}$ bits 1111 are delivered as inputs to the respective XOR gates 427a, 427b, 427c and 427d. The skilled artisan will recognize the following truth table for an XOR gate:

TABLE 2

| Input A | Input B | Output |
|---|---|---|
| 0 | 0 | 0 |
| 0 | 1 | 1 |
| 1 | 0 | 1 |
| 1 | 1 | 0 |

Assume for the purposes of this illustration that the 0010 data value is to be transmitted from the semiconductor chip 405 to the semiconductor chip 415. The master XOR block 423 takes the input data value 0010 and performs XOR functions on that 0010 value to encrypt it into an encrypted 4-bit number that will be propagated through the semiconductor chip 410 and ultimately delivered to the semiconductor chip 415 where it will be decrypted back into the original data value 0010. Table 3 below lists the XOR operations performed by the XOR block 423 depending on the destination chip for the 0010 data value.

TABLE 3

| Destination Chip | XOR Calculations |
|---|---|
| Chip 410 | 0010⊕$Key_{405}$ bits⊕$Key_{410}$ bits |
| Chip 415 | 0010⊕$Key_{405}$ bits⊕$Key_{410}$ bits⊕$Key_{415}$ bits |
| Chip 420 | 0010⊕$Key_{405}$ bits⊕$Key_{410}$ bits⊕$Key_{415}$ bits⊕$Key_{420}$ bits | where the ⊕ symbol denotes an XOR operation. Thus where the destination chip is the semiconductor chip 415, the XOR calculations for the data value of 0010 and the key bits listed in Table 1 above are $$0010 \oplus 1111 \oplus 1110 \oplus 1010 = 1001 \tag{1}$$

where the XOR calculations are done on a per bit basis. Take for example the first XOR calculation 0010⊕1111. Here the first bit, bit 0, of the data value 0010 is XORed with the first bit, bit 1, of the $Key_{405}$ bits, in other words 0⊕1, which yields a value of 1. Next, the second bit, bit 0, of the data value 0010 is XORed with the second bit, bit 1, of the $Key_{405}$ bits, in other words 0⊕1, which yields a value of 1. Next, the third bit, bit 1, of the data value 0010 is XORed with the third bit, bit 1, of the $Key_{405}$ bits, in other words 1⊕1, which yields a value of 0 and so on for the last bit, bit 0, of the data value 0010 and the last bit, bit 1, of the $Key_{405}$ bits. Thus $$0010 \oplus 1111 = 1101 \tag{2}$$

That value 1101 from Equation (2) is next XORed with the Key$_{410}$ key bits 1110 on the same bit per bit basis to yield $$1101 \oplus 1110 = 0011 \quad (3)$$

and then that value 0011 is next XORed with the Key$_{415}$ key bits 1010 on the same bit per bit basis to yield $$0011 \oplus 1010 = 1001 \quad (4)$$

which, of course, is the result for Equation (1). The bit values 1001 from Equations (1) and (4) are delivered as inputs to the XOR gates 427a, 427b, 427c and 427d along with the Key$_{405}$ bits 1111 as shown in FIG. 5. The XOR gate 427a then performs an XOR operation on the bits 1 and 1 to yield a value of 0, the XOR gate 427b performs an XOR operation on the bits 0 and 1 to yield a value of 1 and so on for the other XOR gates 427c and 427d. Thus, the outputs of the XOR gates 427a, 427b, 427c and 427d are 0110 as shown at the inputs to the TFETs 255a, 255b, 255c and 255d, respectively. The gate control circuit 292 is outputting a logic 1 HIGH signal so the TFETs 255a, 255b, 255c and 255d are turned on and the encrypted value 0110 is passed to the semiconductor chip 410.

The semiconductor chip 410 includes the 4-bit encryption key Key$_{410}$ and four XOR gates 431a, 431b, 431c and 431d. The Key$_{410}$ bits 1110 are delivered as inputs to the respective XOR gates 431a, 431b, 431c and 431d. The encrypted value 0110 from the semiconductor chip 405 is delivered on a per bit basis as the other inputs to the XOR gates 431a, 431b, 431c and 431d. The XOR gates 431a, 431b, 431c and 431d perform the following XOR operations $$0110 \oplus 1110 = 1000 \quad (5)$$

on a per bit basis as was described for the XOR operations performed by the XOR gates 427a, 427b, 427c and 427d. That value 1000 from Equation (5) constitutes Data Received by the semiconductor chip 410. The value 0010 sent from the semiconductor chip 405 is intended for the consumption of the semiconductor chip 415 only. Since the value 0010 has been transformed into the value 1000, the semiconductor chip 410 only sees the encrypted value 1000, not the true value 0010. Thus, the outputs of the XOR gates 431a, 431b, 431c and 431d are 1000 as shown at the inputs to the TFETs 340a, 340b, 340c and 340d, respectively. The gate control circuit 330 is outputting a logic 1 HIGH signal so the TFETs 340a, 340b, 340c and 340d are turned on and the encrypted value 1000 is passed to the semiconductor chip 415.

The semiconductor chip 415 includes the 4-bit encryption key Key$_{415}$ and four XOR gates 436a, 436b, 436c and 436d. The Key$_{415}$ bits 1010 are delivered as inputs to the respective XOR gates 436a, 436b, 436c and 436d. The encrypted value 1000 from the semiconductor chip 410 is delivered on a per bit basis as the other inputs to the XOR gates 436a, 436b, 436c and 436d. The XOR gates 436a, 436b, 436c and 436d perform the following XOR operations $$1000 \oplus 1010 = 0010 \quad (6)$$

on a per bit basis as was described for the XOR operations performed by the XOR gates 427a, 427b, 427c and 427d. That value 0010 from Equation (6) is the original true value transmitted from the semiconductor chip 405 now decrypted and constitutes Data Received by the semiconductor chip 415. The value 0010 sent from the semiconductor chip 405 is intended for the consumption of the semiconductor chip 415 only. To keep the now decrypted value 0010 from being observable by the semiconductor chip 420, the gate control circuit 361, on instruction from the switching control logic block 290 of the semiconductor chip 405, turns off the TFETs 371a, 371b, 371c and 371d by swinging the gate input signals to logic LOW 0, thereby preventing the value 0010 from passing to the semiconductor chip 420. The outputs of the TFETs 371a, 371b, 371c and 371d will simply be logic LOW 0.

Of course, if the data value 0010 had been intended for consumption by the semiconductor chip 420 only, then the same types of XOR operations just described would be performed to encrypt and decrypt the true value 0010 for consumption by the semiconductor chip 420 using the Key$_{420}$ and the XOR gates 441a, 441b, 441c and 441d of the semiconductor chip 420. The gate control circuit 386, on instruction from the switching control logic block 290 of the semiconductor chip 405, turns off the TFETs 391a, 391b, 391c and 391d by swinging the gate input signals to logic LOW 0, thereby preventing a decrypted data value from passing beyond the semiconductor chip 420. Note that the foregoing data transmission can occur repeatedly for all sorts of data values and at speeds as fast or slow as the semiconductor chip architecture of the semiconductor chip stack 400 allows.

Figure 6:
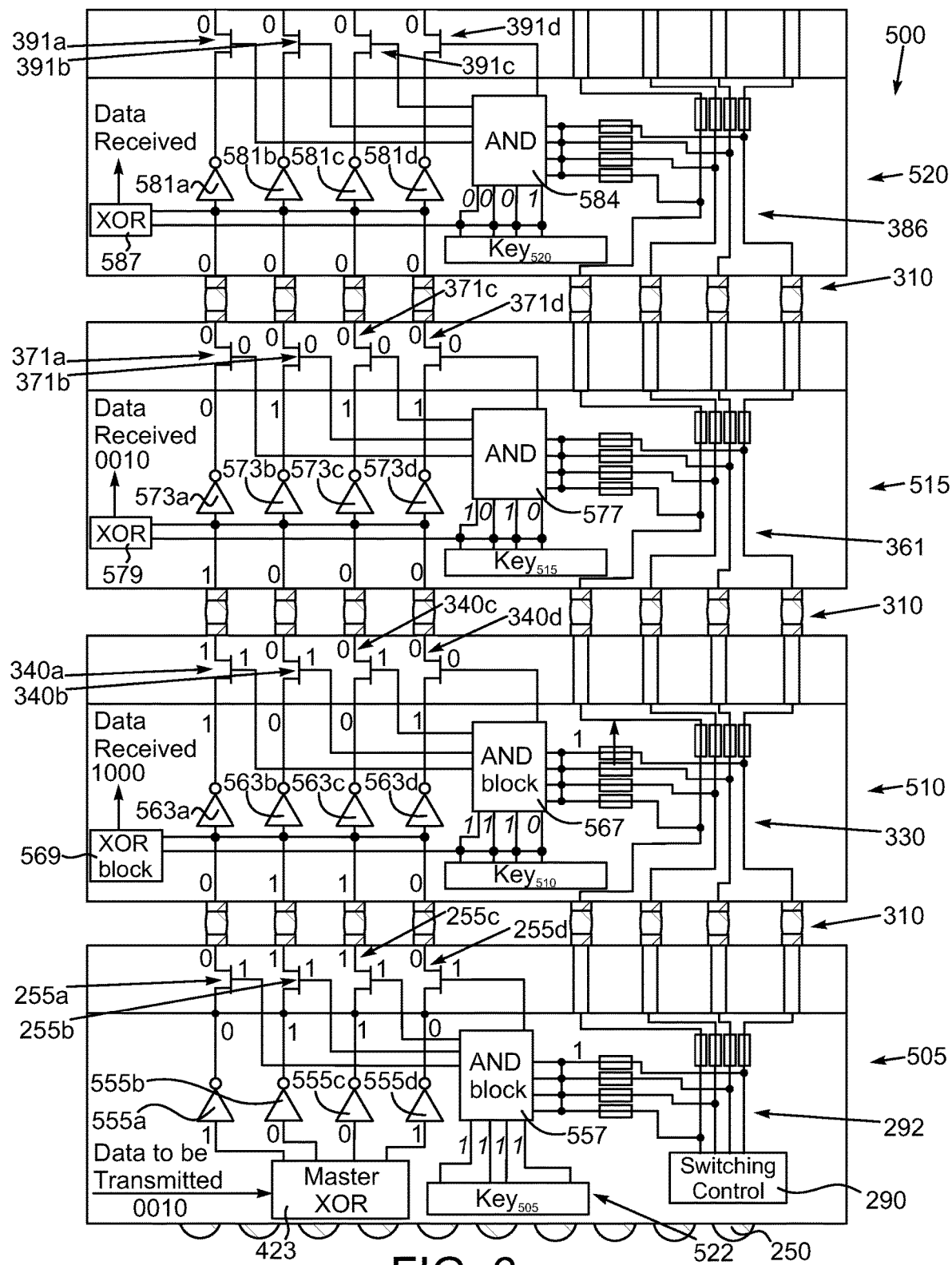
FIG. 6 is a schematic sectional view like FIG. 5, but of another alternate exemplary arrangement of a chip stack arrangement.

An alternate exemplary arrangement of a chip stack 500 that incorporates data compartmentalization, encryption and decryption may be understood by referring to FIG. 6. FIG. 6 is a sectional-like schematic view similar to FIG. 5 and depicts the semiconductor chip stack 500 with semiconductor chips 505, 510, 515, and 520. The semiconductor chips 505, 510, 515, and 520 share many of the same attributes as the semiconductor chips 205, 210, 215 and 220 depicted in FIG. 4 and described above. In this regard, the semiconductor chip to 505 includes the TFETs 255a, 255b, 255c and 255d as well as the interconnects 250, the switching control logic block 290 and the gate control network 292. The individual components of the gate control network 292 will not be shown in FIG. 6 for simplicity of illustration. The semiconductor chip 510 similarly includes the TFETs 340a, 340b, 340c and 340d, as well as the gate control network 330, which like the gate control network 292, will not include additional element numbering of the individual components for simplicity of illustration. The semiconductor chips 505 and 510 are electrically connected by way of the plural interconnects 310. Similar pluralities of the interconnects 310 connect the semiconductor chips 510 and 515 and 515 and 520, respectively. The semiconductor chip 515 similarly includes the TFETs 371a, 371b, 371c and 371d, as well as the gate control network 361. Finally, the semiconductor chip 520 includes the TFETs 391a, 391b, 391c and 391d as well as the gate control network 386.

Like the semiconductor chip stack 400 shown in FIG. 5, the exemplary semiconductor chip stack 500 depicted in FIG. 6 incorporates encryption schemes in order to encrypt data that is transferred from one chip to another. This illustrative encryption scheme will now be described. To simplify the discussion, a simple 4-bit data transmission scheme will be described. However, the skilled artisan will appreciate that other than 4-bit data can be handled with appropriate scaling up of the hardware to be described. The semiconductor chip 505 has an encryption circuit 522 that includes the Master exclusive OR (XOR) block 423 discussed above and a 4-bit encryption key Key$_{505}$, which can be identical to the Key$_{405}$ and shown in FIG. 5 and include four key bits 1111. However, in lieu of the four XOR gates 427a, 427b, 427c and 427d used in FIG. 5, the semiconductor chip 505 uses four inverters 555a, 555b, 555c and 555d as part of the encryption hardware. The outputs of the inverters 555a 555b, 555c and 555d are tied to the inputs of the TFETs 255a, 255b, 255c and 255d, respectively. The master XOR block 423 has four outputs, one for each of the inverters 555a, 555b, 555c and 555d. Note that the Key$_{505}$ bits 1111 are denoted in italics to distinguish them from the outputs of the master XOR block 423. The semiconductor chip 510 includes a 4-bit Key$_{510}$ with four key bits 1110, the semiconductor chip 515 includes a 4-bit key Key$_{515}$ with key bits 1010 and the semiconductor chip 520 includes a 4-bit key Key$_{520}$ with key bits 0001. Table 4 below summarizes the key bits for the keys Key$_{505}$, Key$_{510}$, Key$_{515}$ and Key$_{520}$.

TABLE 4

| Key | Key bits |
|---|---|
| Key$_{505}$ | Key$_{505}$ bits = 1111 |
| Key$_{510}$ | Key$_{510}$ bits = 1110 |
| Key$_{515}$ | Key$_{515}$ bits = 1010 |
| Key$_{520}$ | Key$_{520}$ bits = 0001 |

The Key$_{505}$ bits 1111 are delivered as inputs to an AND block 557. As described in more detail below, the AND block 557 consists of four AND gates, one for each key bit. Each of the AND gates has two inputs: one of the Key$_{505}$ key bits and the gate control signal from the gate control circuit 292, which is in this illustration logic 1 HIGH. Thus when the gate control signal is logic 1 HIGH, the AND block 557 will output the Key$_{505}$ key bits 1111 as gate inputs to the TFETs 255a, 255b, 255c and 255d, respectively. Thus all the TFETs 255a, 255b, 255c and 255d will turn on and pass the outputs of the inverters 555a, 555b, 555c and 555d. When the gate control signal input to the AND block 557 is logic 0 LOW, the AND block 557 will output logic 0 LOW as gate inputs to the TFETs 255a, 255b, 255c and 255d, respectively, thereby turning them off and blocking the outputs of the inverters 555a, 555b, 555c and 555d from leaving the semiconductor chip 505.

Assume for the purposes of this illustration that a 0010 data value is to be transmitted from the semiconductor chip 505 to the semiconductor chip 515. The master XOR block 423 takes the input data value 0010 and performs XOR functions on that 0010 value to encrypt it into an encrypted 4-bit number that will be propagated through the semiconductor chip 510 and ultimately delivered to the semiconductor chip 515 where it will be decrypted back into the original data value 0010. Table 5 below lists the XOR operations performed by the XOR block 423 depending on the destination chip for the 0010 data value.

TABLE 5

| Destination Chip | XOR Calculations |
|---|---|
| Chip 510 | 0010⊕Key$_{505}$ bits⊕Key$_{510}$ bits |
| Chip 515 | 0010⊕Key$_{505}$ bits⊕Key$_{510}$ bits⊕Key$_{515}$ bits |
| Chip 520 | 0010⊕Key$_{505}$ bits⊕Key$_{510}$ bits⊕Key$_{515}$ bits⊕Key$_{520}$ bits | where again the ⊕ symbol denotes an XOR operation. Thus where the destination chip is the semiconductor chip 515, the XOR calculations for the data value of 0010 and the key bits listed in Table 4 above are $$0010 \oplus 1111 \oplus 1110 \oplus 1010 = 1001 \quad (6)$$

where the XOR calculations are done on a per bit basis. Take for example the first XOR calculation 0010⊕1111. Here the first bit, bit 0, of the data value 0010 is XORed with the first bit, bit 1, of the Key, bits, in other words 0⊕1, which yields a value of 1. Next, the second bit, bit 0, of the data value 0010 is XORed with the second bit, bit 1, of the Key$_{505}$ bits, in other words 0⊕1, which yields a value of 1. Next, the third bit, bit 1, of the data value 0010 is XORed with the third bit, bit 1, of the Key$_{505}$ bits, in other words 1⊕1, which yields a value of 0 and so on for the last bit, bit 0, of the data value 0010 and the last bit, bit 1, of the Key$_{505}$ bits. Thus $$0010 \oplus 1111 = 1101 \quad (7)$$

That value 1101 from Equation (7) is next XORed with the Key$_{510}$ key bits 1110 on the same bit per bit basis to yield $$1101 \oplus 1110 = 0011 \quad (8)$$

and then that value 0011 is next XORed with the Key$_{515}$ key bits 1010 on the same bit per bit basis to yield $$0011 \oplus 1010 = 1001 \quad (9)$$

which, of course, is the result for Equation (6). The bit values 1001 from Equations (6) and (9) are delivered as inputs to the inverters 555a, 555b, 555c and 555d. The inverters 555a, 555b, 555c and 555d then invert the bit values 1001 to 0110 and deliver those 0110 bits as inputs to the TFETs 255a, 255b, 255c and 255d, respectively, where they are passed along to respective inputs of inverters 563a, 563b, 563c and 563d of the semiconductor chip 510.

The semiconductor chip 510 includes the 4-bit encryption key Key$_{510}$, an AND block 567 and the aforementioned inverters 563a, 563b, 563c and 563d. The 0110 bit values received from the TFETs 255a, 255b, 255c and 255d are input both to the inverters 563a, 563b, 563c and 563d and to an XOR block 569. In addition, the Key$_{510}$ key bits 1110 are delivered as inputs to the XOR block 569. As described in more detail below in conjunction with FIG. 8, the XOR block 569 consists of four XOR gates, one for each key bit. Each of the XOR gates has two inputs: one of the Key$_{510}$ key bits 1111 and one of the inputs to the inverters 563a, 563b, 563c and 563d. The XOR block 569 converts the 0110 bits input into Data Received bits 1000. But note that the Data Received bits 1000 does not match the original data 0010. This is by design, since the 0010 data was not intended to be viewable by the semiconductor chip 510, but only the semiconductor chip 515. Thus, from the point of view of the semiconductor chip 510, the transmitted data is 1000, not the true data 0010. The inverters 563a, 563b, 563c and 563d invert the bit values 0110 received from the TFETs 255a, 255b, 255c and 255d to 1001 and deliver those 1001 bits as inputs to the TFETs 340a, 340b, 340c and 340d, respectively. Concurrently, the Key$_{510}$ bits 1110 are delivered as inputs to the AND block 567. As described in more detail below in conjunction with FIG. 7, the AND block 567, like the AND block 557 of semiconductor chip 505, consists of four AND gates, one for each key bit. Each of the AND gates has two inputs: one of the Key$_{510}$ key bits and the gate control signal from the gate control circuit 330, which is in this illustration is logic 1 HIGH. Thus when the gate control signal is logic 1 HIGH, the AND block 567 will output the Key$_{510}$ key bits 1110 as gate inputs to the TFETs 340a, 340b, 340c and 340d, respectively. Thus the TFETs 340a, 340b and 340c will turn on and pass the outputs of the inverters 563a, 563b and 563c, but the TFET 340d will turn off and pass logic 0 LOW, so that the output of the inverter 563d is not passed on. Thus, the TFETs 340a, 340b, 340c and 340d will pass bit values 1000 to inputs of inverters 573a, 573b, 573c and 573d, respectively, of the semiconductor chip 515.

The semiconductor chip 515 includes the 4-bit encryption key Key$_{515}$, an AND block 577 and the aforementioned inverters 573a, 573b, 573c and 573d. The 1000 bit values received from the TFETs 340a, 340b, 340c and 340d are input both to the inverters 573a, 573b, 573c and 573d and to an XOR block 579. In addition, the $Key_{515}$ key bits 1010 are delivered as inputs to the XOR block 579. The XOR block 579 consists of four XOR gates, one for each key bit. Each of the XOR gates has two inputs: one of the $Key_{515}$ key bits 1010 and one of the inputs to the inverters 573a, 573b, 573c and 573d. The XOR block 579 converts the 1000 bit values received from the TFETs 340a, 340b, 340c and 340d into Data Received bits 0010. Note that the Data Received bits 0010 do match the original data 0010 generated, encrypted and sent by the semiconductor chip 505. This is by design, since the 0010 data was intended to be viewable by the semiconductor chip 515 only. Thus, from the point of view of the semiconductor chip 515, the transmitted data is the true data 0010. The inverters 573a, 573b, 573c and 573d invert the bit values 1000 received from the TFETs 340a, 340b, 340c and 340d to 0111 and deliver those 0111 bits as inputs to the TFETs 371a, 371b, 371c and 371d, respectively. Concurrently, the $Key_{515}$ bits 1010 are delivered as inputs to the AND block 577. As described in more detail below, the AND block 577, like the AND block 557 of semiconductor chip 505, consists of four AND gates, one for each key bit. Each of the AND gates has two inputs: one of the $Key_{515}$ key bits and the gate control signal from the gate control circuit 361, which is in this illustration logic 0 LOW. Thus when the gate control signal is logic 0 LOW, the AND block 577 will output logic 0 LOW as gate inputs to the TFETs 371a, 371b, 371c and 371d, respectively. Thus the TFETs 371a, 371b, 371c and 371d will turn off and not pass the outputs of the inverters 573a, 573b, 573c and 573d to inputs of inverters 581a, 581b, 581c and 581d of the semiconductor chip 520. In this way, the semiconductor chip 520 is prevented from seeing the outputs of the TFETs 371a, 371b, 371c and 371d. Of course, if the semiconductor chip 520 was the intended recipient of the transmitted data, then the gate control signal input to the AND block 577 would logic 1 HIGH. Note that the foregoing data transmission can occur repeatedly for all sorts of data values and at speeds as fast or slow as the semiconductor chip architecture of the semiconductor chip stack 500 allows.

Although the semiconductor chip 520 was not the intended recipient of the transmitted data 0010 in this example, it could have been and therefore includes the same basic decryption features as the semiconductor chips 510 and 515. In this regard, the semiconductor chip 520 includes the 4-bit encryption key $Key_{520}$, an AND block 584 and the aforementioned inverters 581a, 581b, 581c and 581d. Any bit values received from the TFETs 371a, 371b, 371c and 371d would be input both to the inverters 581a, 581b, 581c and 581d and to an XOR block 587. In addition, the $Key_{520}$ key bits 0001 would be delivered as inputs to the XOR block 587. The XOR block 587 consists of four XOR gates, one for each key bit. Each of the XOR gates has two inputs: one of the $Key_{520}$ key bits 0001 and one of the inputs to the inverters 581a, 581b, 581c and 581d. The XOR block 587 would convert the bit values received from the TFETs 371a, 371b, 371c and 371d into Data Received bits.

Figure 7:
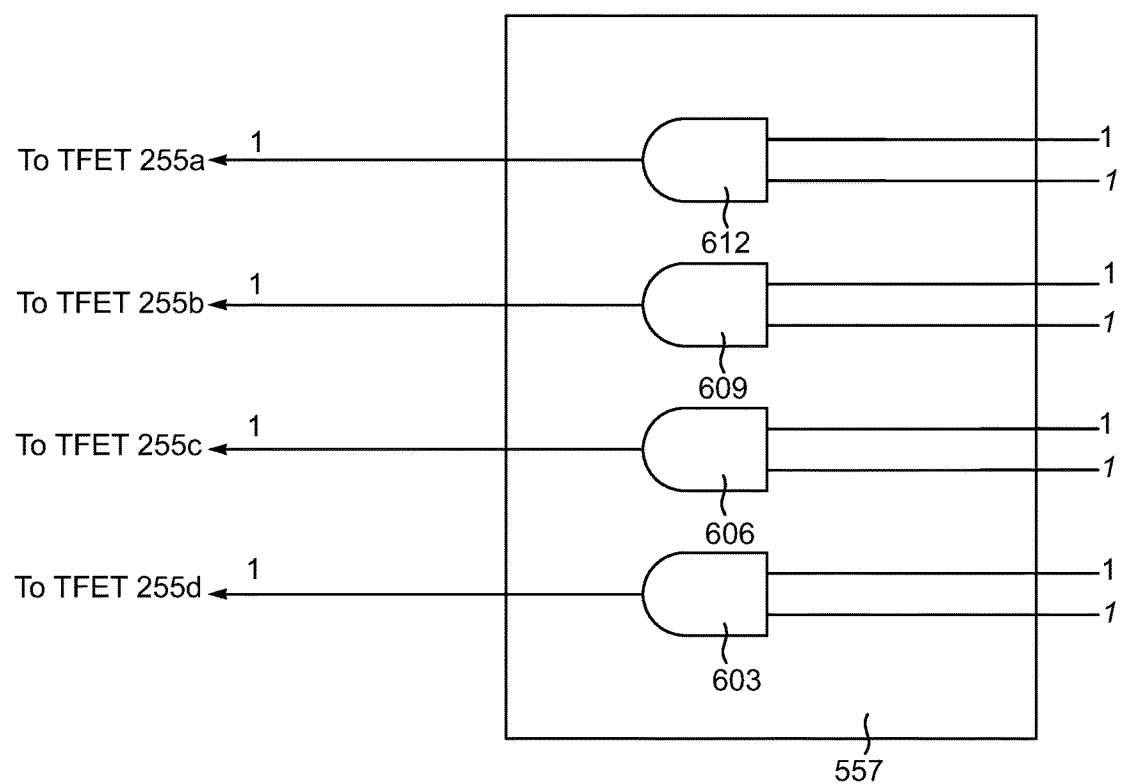
FIG. 7 is a schematic view of an exemplary AND block.

Additional details regarding the AND block 557 depicted in FIG. 6 will now be described in conjunction with FIG. 7, which is a schematic view. As noted above, the AND block 557 consists of four AND gates 603, 606, 609 and 612. One input to each of the AND gates 603, 606, 609 and 612 is the gate control signal from the gate control circuit 292 shown in FIG. 6, and for the present discussion is logic 1 HIGH. The other input to each of the AND gates 603, 606, 609 and 612 is one of the $Key_{505}$ key bits 1111. The respective outputs of the AND gates 603, 606, 609 and 612, in this example, all logic 1 HIGH, are delivered to the inputs of the TFETs 255a, 255b, 255c and 255d. The foregoing description is applicable to the other AND blocks 567, 577 and 584, albeit with inputs of the appropriate key bits and outputs to the appropriate TFETs in a given chip.

Figure 8:
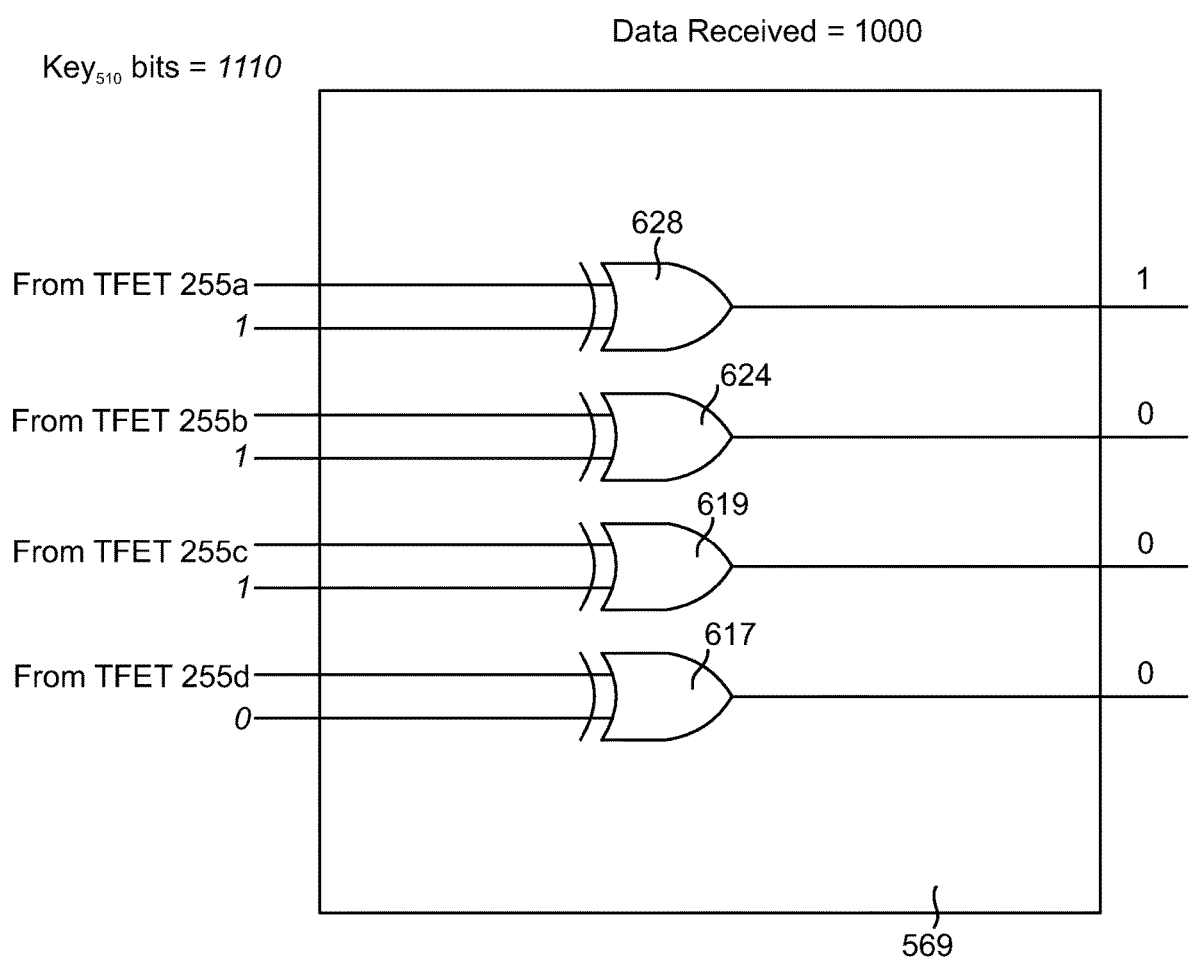
FIG. 8 is a schematic view of an exemplary XOR block.

Additional details regarding the XOR block 569 depicted in FIG. 6 will now be described in conjunction with FIG. 8, which is a schematic view. As note above, the XOR block 569 consists of four XOR gates 617, 619, 624 and 628. One input to each of the XOR gates 617, 619, 624 and 628 is the output from one of the TFETs 255a, 255b, 255c and 255d. The other input to each of the XOR gates 617, 619, 624 and 628 is one of the $Key_{510}$ key bits 1110. The respective outputs of the XOR gates 617, 619, 624 and 628, in this example, the bit values 1000, constitutes the Data Received. The foregoing description is applicable to the other XOR blocks 579 and 587, albeit with inputs of the appropriate key bits and the appropriate TFETs for a given chip.

Figure 9:
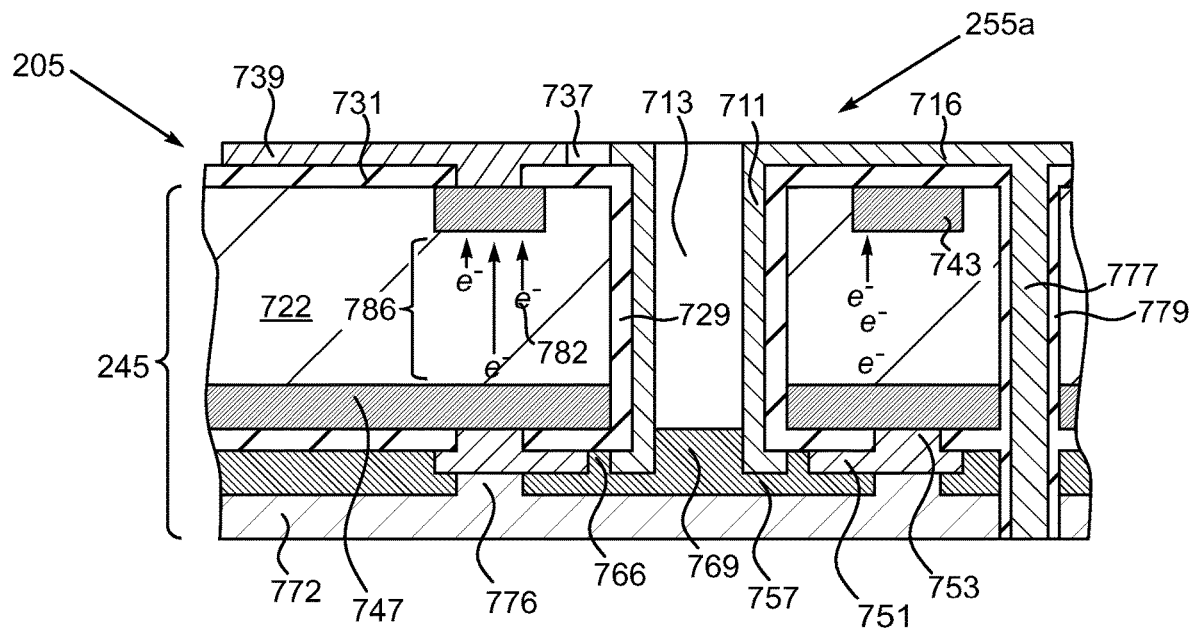
FIG. 9 is a sectional view of an exemplary through-silicon field effect transistor.
Figure 10:
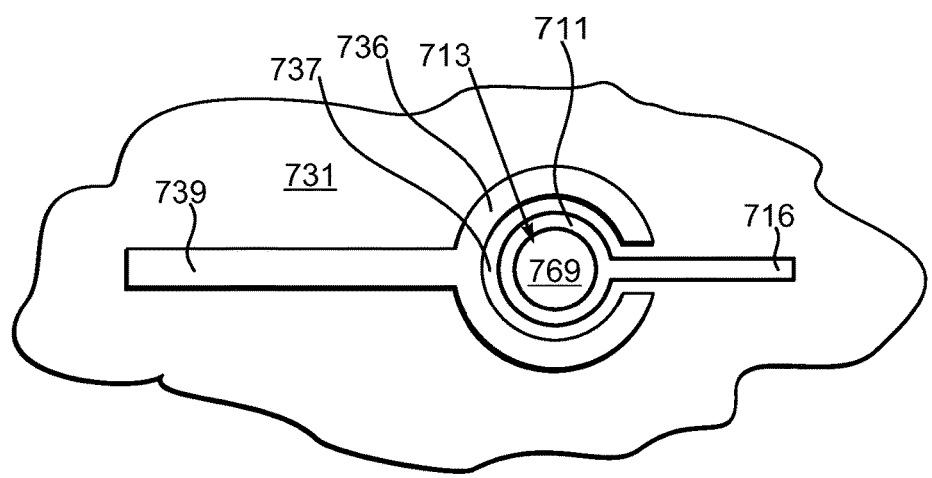
FIG. 10 is a plan view of the exemplary through-silicon field effect transistor.

An exemplary arrangement for the many TFETs disclosed herein can be understood by referring now to FIG. 9, which is a sectional view, and to FIG. 10, which is a plan view of the TFET 255a of the semiconductor chip 205 depicted schematically in FIG. 4. In this regard, the TFET 255a is implemented in the bulk semiconductor portion 245 and includes a gate electrode 711 that is a generally cylindrical shell structure with an internal bore 713 and composed of any of a variety of conductive materials, such as, for example, copper, aluminum, a laminate of ruthenium, tantalum nitride and ruthenium. The gate electrode 711 can include a conducting line 716 that extends laterally and can be connected to some overlying structure such as one of the interconnects 310 depicted in FIG. 4, for example. The gate electrode 711 traverses a semiconductor layer 722 but is electrically insulated therefrom by way of a liner insulating layer 729, which can be composed of silicon oxide SiOx. Note that the liner insulating layer 729 includes an upper sheet portion 731 which is formed on the upper surface of the semiconductor layer 722. A transistor drain electrode 736 is formed also in a ring-like shape as more evident in FIG. 11 such that the gate electrode 711 is nested within the interior of the drain electrode 736 to leave a gap 737. The drain electrode 736 can be composed of the same types of metallic materials used for the gate electrode 711. The drain electrode 736 not only includes the conductor structure shown but also can include a conductor line 739 which can be used to connect to some overlying conductor structure such as one of the interconnects 310. A drain 743 composed of a n+ type impurity region is formed in the semiconductor layer 722 by appropriate introduction of impurities such as n+ impurities, assuming that the semiconductor region 722 is a p-type silicon type layer. The source 747 of the transistor 255a consists of a ring-like impurity region that is formed in the semiconductor layer 722 and can, like the drain 743, consist of a n-type impurity region formed by the appropriate introduction of n-type impurities. Metallization contacts to the source 749 can be by way of an annular metal contact 751 which includes a projecting portion 753 that projects through an annular opening in the liner insulating layer 729 that is positioned beneath the source 747. A photoresist layer 757 is positioned beneath the liner insulating layer 729 and includes an annular projection 766 that is designed to electrically insulate the gate electrode 711 from the electrical contact portion 751. Note that the photoresist layer 757 has a central portion 769 that projects upwardly into the bore 713 of the gate electrode 711. A bulk conductor pad or layer 772 is formed underneath the resist layer 757 and includes a projecting annular portion 776 that makes electrical contact with the annular contact 751. The gate electrode 711 includes a through via 777 that is lined with a liner portion 779 of the liner insulation layer 729. The through via 777 is used to connect to some underlying conductor structure, such as one of the gate control lines, say gate control line 285d shown in FIG. 4. The liner portion insulates the through via 777 from the bulk conductor pad 772. When the gate electrode 711 is swung HIGH, carriers (electrons) 782 flow in the channel region 786 surrounding the gate electrode 711 from the source 747 to the drain 743.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip stack, comprising:
    a first semiconductor chip comprising:
        a first logic layer that includes a switching control logic block, first programmable elements, and second programmable elements; and
        a first silicon layer on the first logic layer that includes:
            plural first through-silicon transistors connected to the switching control logic block through the second programmable elements and plural first through-silicon vias connected to the switching control logic block through the first programmable elements; and
        a second semiconductor chip having plural second through-silicon transistors stacked on the first semiconductor chip, the second semiconductor chip configured to receive transmission of data from the plural first through silicon transistors and control signals from the plural first through-silicon vias,
        wherein the first programmable elements are programmable to selectively pass transistor on or off signals to the plural first through-silicon transistors, and the second programmable elements are programmable to selectively pass the transistor on or off signals to the plural second through-silicon transistors of the second semiconductor chip.

2. The semiconductor chip stack of claim 1, comprising a third semiconductor chip stacked on the second semiconductor chip, the second semiconductor chip including a second logic layer and a second silicon layer on the second logic layer, the second silicon layer having the plural second through-silicon transistors operable to selectively control a flow of data from the second semiconductor chip to the third semiconductor chip and having plural second through-silicon vias to convey control signals to the third semiconductor chip.

3. The semiconductor chip stack of claim 1, wherein the plural first through-silicon transistors comprise through-silicon field effect transistors.

4. The semiconductor chip stack of claim 1, wherein the switching control logic block is operable to deliver transistor on or off signals to the plural first through-silicon transistors and the plural second through-silicon transistors.

5. The semiconductor chip stack of claim 1, wherein the plural second through-silicon transistors are through-silicon field effect transistors.

6. The semiconductor chip stack of claim 1, wherein the first programmable elements and the second programmable elements comprise fuses or anti-fuses.

7. The semiconductor chip stack of claim 1, wherein the switching control logic block is operable to selectively pass transistor on or off signals through the first programmable elements but not through the second programmable elements.

8. The semiconductor chip stack of claim 4, wherein the switching control logic block is operable to selectively transmit transistor on or off signals through the first programmable elements but not through the second programmable elements.

9. An apparatus, comprising:
    a first semiconductor chip comprising:
        a first logic layer that includes a switching control block, first programmable elements, and second programmable elements; and
        a first silicon layer on the first logic layer that includes:
            plural first through-silicon transistors connected to the switching control logic block through the second programmable elements and plural first through-silicon vias connected to the switching control logic block through the first programmable elements; and
        a second semiconductor chip having plural second through-silicon transistors stacked on the first semiconductor chip, the second semiconductor chip configured to receive transmission of data from the plural first through silicon transistors and control signals from the plural first through-silicon vias, wherein the first programmable elements are programmable to selectively pass transistor on or off signals to the plural first through-silicon transistors, and the second programmable elements are programmable to selectively pass the transistor on or off signals to the plural second through-silicon transistors of the second semiconductor chip, wherein the first semiconductor chip includes an encryption circuit operable to encrypt the data.

10. The apparatus of claim 9, wherein the plural first through-silicon transistors comprise through-silicon field effect transistors.

11. The apparatus of claim 9, wherein the switching control logic block is operable to deliver transistor on or off signals to the plural first through-silicon transistors and the second semiconductor chip.

12. The apparatus of claim 11, wherein the second programmable elements selectively pass the transistor on or off signals to second through-silicon vias.

13. The apparatus of claim 9, comprising the second semiconductor chip stacked on the first semiconductor chip.

14. A method of manufacturing, comprising:
    stacking a first semiconductor chip on a second semiconductor chip,
    the first semiconductor chip comprising:
        a first logic layer that includes a switching control logic block, first programmable elements, and second programmable elements; and
        a first silicon layer on the first logic layer that includes:
            plural first through-silicon transistors connected to the switching control logic block through the second programmable elements and plural first through-silicon vias connected to the switching control logic block through the first programmable elements; and the second semiconductor chip having plural second through-silicon transistors and configured to receive transmission of data from the plural first through silicon transistors and receive control signals from the plural first through-silicon vias, wherein the first programmable elements are programmable to selectively pass transistor on or off signals to the plural first through-silicon transistors, and the second programmable elements are programmable to selectively pass the transistor on or off signals to the plural second through-silicon transistors of the second semiconductor chip; and mounting the stacked semiconductor chips on a circuit board.

15. The method of claim 14, further comprising stacking a third semiconductor chip on the first semiconductor chip, the first semiconductor chip including a second logic layer and a second silicon layer on the second logic layer, the second silicon layer having the plural second through-silicon transistors operable to selectively control a flow of data from the first semiconductor chip to the third semiconductor chip and having plural second through-silicon vias to convey control signals to the third semiconductor chip.

16. The method of claim 14, wherein the plural first through-silicon transistors comprise through-silicon field effect transistors.

17. The method of claim 15, wherein the switching control logic block is operable to deliver transistor on or off signals to the plural first through-silicon transistors and to the plural second through-silicon transistors.

18. The method of claim 17, wherein the plural second through-silicon transistors comprise through-silicon field effect transistors.

19. The method of claim 18, wherein the first programmable elements and the second programmable elements comprise fuses or anti-fuses.

20. The method of claim 14, wherein the second semiconductor chip comprises an encryption circuit operable to encrypt the data.

* * * * *